United States Patent
Furuie

(10) Patent No.: US 10,847,730 B2
(45) Date of Patent: Nov. 24, 2020

(54) DISPLAY DEVICE

(71) Applicant: Japan Display Inc., Minato-ku (JP)

(72) Inventor: Masamitsu Furuie, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/646,627

(22) Filed: Jul. 11, 2017

(65) Prior Publication Data

US 2018/0062091 A1  Mar. 1, 2018

(30) Foreign Application Priority Data

Aug. 30, 2016 (JP) .................................. 2016-168161

(51) Int. Cl.
*H01L 51/00* (2006.01)
*H01L 27/32* (2006.01)
(Continued)

(52) U.S. Cl.
CPC ............ *H01L 51/0097* (2013.01); *B32B 3/08* (2013.01); *B32B 7/06* (2013.01); *B32B 7/12* (2013.01);
(Continued)

(58) Field of Classification Search
CPC ......... H01L 51/0097; H01L 2251/5338; H01L 27/3244; H01L 27/3276; C22F 1/006;
(Continued)

(56) References Cited

U.S. PATENT DOCUMENTS 10,141,389 B2 * 11/2018 Furuie ................. H01L 51/5237
2008/0315311 A1 * 12/2008 Okamoto ............. H01Q 1/2225
257/347
(Continued)

FOREIGN PATENT DOCUMENTS

JP 11109880 A * 4/1999
JP 2006-163099 6/2006
(Continued)

OTHER PUBLICATIONS

Office Acton dated Jun. 22, 2018 in Korean Patent Application No. 10-2017-0090225, (with unedited computer generated English translation), 9 pages.
Office Action dated Apr. 24, 2019 in Chinese Application No. 201710570822.7 (w/English translation).
Office Action dated Aug. 4, 2020, in Japanese Patent Application No. 2016-168161, filed Aug. 30, 2016, w/Computer Generated English Translation.

*Primary Examiner* — Nicholas J Tobergte
*Assistant Examiner* — Kien C Ly
(74) *Attorney, Agent, or Firm* — Oblon, McClelland, Maier & Neustadt, L.L.P.

(57) ABSTRACT

A display device includes a first shape-memory wire that memorizes an extended state and a second shape-memory wire that memorizes a bending state. The laminated layers include a first flexible layer, a second flexible layer, and a display element layer on which light emitting elements are disposed. The first flexible layer includes a first interface between the first flexible layer and a layer in contact with an upper side or a lower side of the first flexible layer. The second flexible layer includes a second interface between the second flexible layer and a layer in contact with an upper side or a lower side of the second flexible layer. The first shape-memory wire is disposed within the first flexible layer or on the first interface. The second shape-memory wire is disposed within the second flexible layer or on the second interface.

14 Claims, 11 Drawing Sheets

(51) Int. Cl.
*H01L 51/52* (2006.01)
*B32B 7/12* (2006.01)
*C22F 1/00* (2006.01)
*B32B 27/08* (2006.01)
*B32B 17/06* (2006.01)
*B32B 27/32* (2006.01)
*B32B 27/28* (2006.01)
*B32B 27/36* (2006.01)
*B32B 7/06* (2019.01)
*B32B 3/08* (2006.01)
*B32B 27/06* (2006.01)

(52) U.S. Cl.
CPC ............ *B32B 17/064* (2013.01); *B32B 27/06* (2013.01); *B32B 27/08* (2013.01); *B32B 27/281* (2013.01); *B32B 27/325* (2013.01); *B32B 27/36* (2013.01); *C22F 1/006* (2013.01); *H01L 27/3244* (2013.01); *H01L 27/3276* (2013.01); *H01L 51/524* (2013.01); *B32B 2255/20* (2013.01); *B32B 2255/24* (2013.01); *B32B 2307/546* (2013.01); *B32B 2307/706* (2013.01); *B32B 2307/748* (2013.01); *B32B 2311/005* (2013.01); *B32B 2457/20* (2013.01); *B32B 2457/208* (2013.01); *H01L 2251/5338* (2013.01)

(58) Field of Classification Search
CPC ..... C22F 1/10; C22F 1/08; H01H 2016/0122; B32B 2311/005; H05K 2201/0308
See application file for complete search history.

(56) References Cited

U.S. PATENT DOCUMENTS

2011/0084898 A1* 4/2011 Ebbeling .................. G06F 1/16
345/156
2016/0007441 A1* 1/2016 Matsueda ............. G06F 1/1652
361/749

FOREIGN PATENT DOCUMENTS

| | | |
|---|---|---|
| JP | 2006163099 A * | 6/2006 |
| JP | 2015-152816 | 8/2015 |
| JP | 2016-15618 | 1/2016 |
| JP | 2016-110114 A | 6/2016 |
| KR | 10-1404628 B1 | 6/2014 |
| KR | 10-2015-0018730 A | 2/2015 |

* cited by examiner

DISPLAY DEVICE

CROSS-REFERENCE TO RELATED APPLICATION

The present application claims priority from Japanese application JP2016-168161 filed on Aug. 30, 2016, the content of which is hereby incorporated by reference into this application.

BACKGROUND OF THE INVENTION

1. Field of the Invention

The present invention relates to a display device.

2. Description of the Related Art

A flexible display has been developed that includes a display element laminated on a bendable and flexible substrate. As disclosed in JP2016-015618A, a flexible display is easy to carry around if it can be folded. In addition, a display capable of being electrically opened and closed is convenient even if both hands of a user are not free. This is enabled by the use of wires composed of a shape-memory alloy, for example.

A shape-memory alloy returns to its original shape when heated. JP2015-152816A discloses that a display can be rolled up and deployed by using both of an originally bent wire and an originally straight wire. However, if the heat applied to one of the wires is transferred to the other wire, the wires are deformed in opposing directions, which causes malfunction.

SUMMARY OF THE INVENTION

One or more embodiments of the present invention have been conceived in view of the above, and an object thereof is to prevent malfunction of a display when the display is electrically deformed.

A display device according to the present invention includes a first shape-memory wire that memorizes an extended state and is configured to be electrically heated, a second shape-memory wire that memorizes a bending state and is configured to be electrically heated, and a plurality of laminated layers. The laminated layers include a first flexible layer, a second flexible layer, a display element layer on which a plurality of light emitting elements are disposed, a circuit layer for controlling the light emitting elements, and a sealing layer that seals the display element layer. The first flexible layer includes a first interface between the first flexible layer and a layer that is in contact with either an upper side or a lower side of the first flexible layer. The second flexible layer includes a second interface, which is different from the first interface, between the second flexible layer and a layer that is in contact with either an upper side or a lower side of the second flexible layer. The first shape-memory wire is disposed within the first flexible layer or on the first interface, and the second shape-memory wire is disposed within the second flexible layer or on the second interface.

According to the present invention, the first shape-memory wires and the second shape-memory wires are portioned away from each other in a laminating direction of the laminated layers, and thus the neat is hardly transferred from each other. This prevents malfunction of the display when the display is electrically deformed.

DETAILED DESCRIPTION OF THE INVENTION

Embodiments of the present invention will be described below in detail with reference to the accompanying drawings. However, the present invention is not to be limited to the embodiments described below and can be implemented in various manners without departing from the spirit of the invention.

In the accompanying drawings, widths, thicknesses, shapes, or other characteristics of each part are schematically illustrated for clarity of illustration compared to actual configurations, although such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the embodiments, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

First Embodiment

Figure 1:
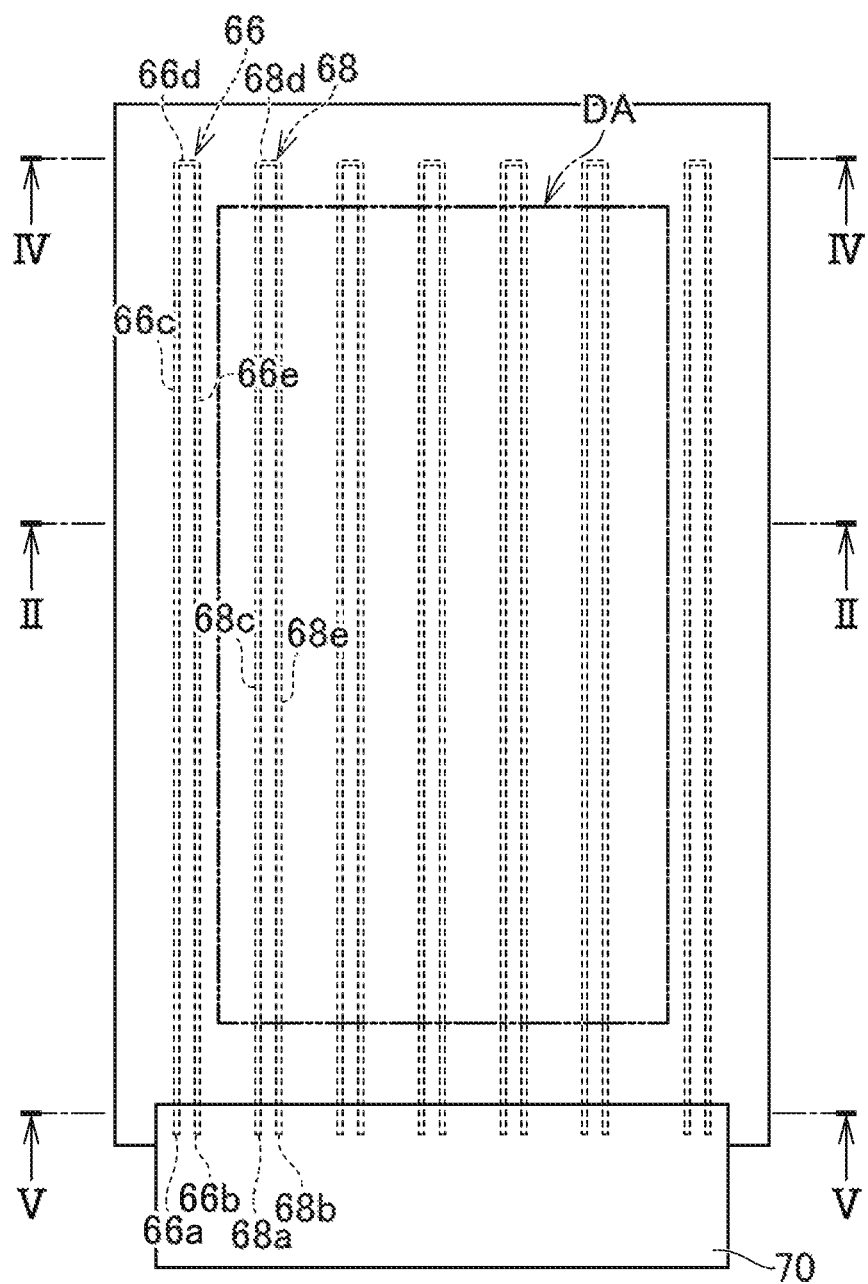
FIG. 1 is a plan view of a display device according to the first embodiment of the present invention.
Figure 1:
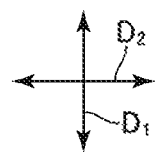

FIG. 1 is a plan view of a display device according to the first embodiment of the present invention. An organic electroluminescence display device will be used as an example of a display device. The display device combines unit pixels (sub-pixels) in multi-colors such as red, green, and blue to form full-color pixels, and displays a full-color image in a display area. The display device includes a display area DA in which a plurality of pixels are disposed in a matrix.

Figure 2:
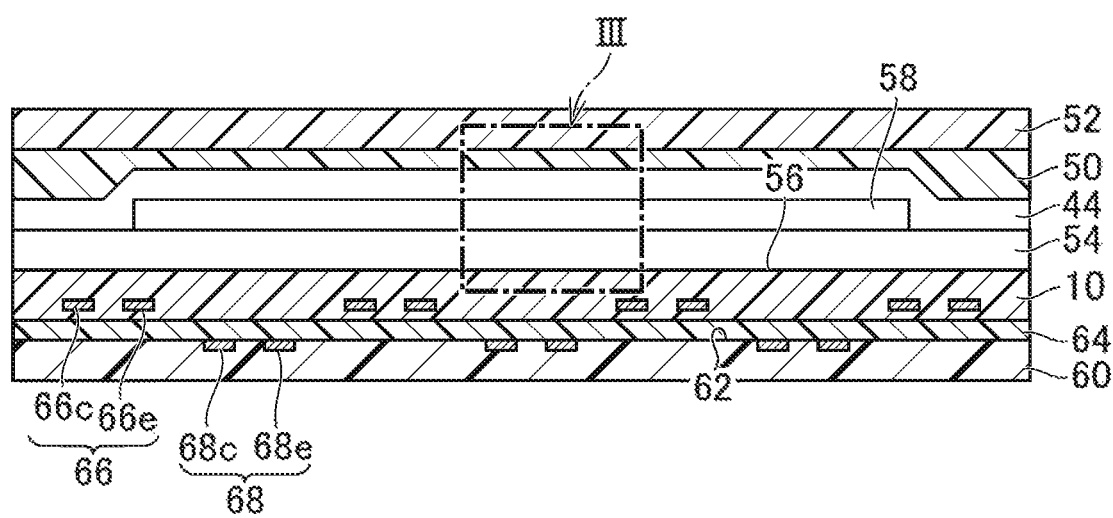
FIG. 2 is a schematic cross-sectional view of the display device taken along the line II-II in FIG. 1.

FIG. 2 is a schematic cross-sectional view of the display device taken along the line II-II in FIG. 1. The display device includes laminated layers. The laminated layers include a first flexible layer 10 made of a polyimide resin or a polyethylene naphthalate, for example.

Figure 3:
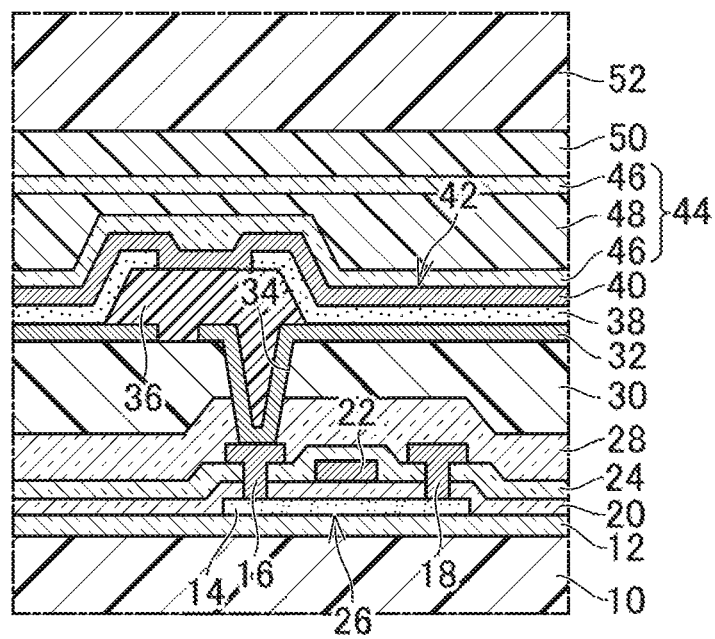
FIG. 3 is an enlarged view of the portion indicated, as III in FIG. 2.

FIG. 3 is an enlarged view of the portion indicated as III in FIG. 2. An undercoat layer 12 is formed on the first flexible layer 10 in order to serve as a barrier to impurities contained in the first flexible layer 10. The undercoat layer 12 is made of a silicon oxide film or a silicon nitride film, for example, or may be a lamination structure of these films. A semiconductor layer 14 is formed on the undercoat layer 12. A source electrode 16 and a drain electrode 18 are electrically connected to the semiconductor layer 14, and a gate insulating film 20 is formed so as to cover the semiconductor layer 14. A gate electrode 22 is formed on the gate insulating film 20, and an insulating interlayer 24 is formed so as to cover the gate electrode 22. The source electrode 16 and the drain electrode 18 penetrate the gate insulating film 20 and the insulating interlayer 24. The semiconductor layer 14, the source electrode 16, the drain electrode 18, and the gate electrode 22 form a thin-film transistor 26. A passivation, film 28 is disposed so as to cover the thin-film transistor 26. A flattening layer 30 is disposed on the passivation film 28.

A plurality of pixel electrodes 32 (e.g., anodes) are disposed on the flattening layer 30 so as to correspond to respective unit pixels SP (sub-pixel). The flattening layer 30 is formed to be flat at least on a surface on which, the pixel electrodes 32 are disposed. The flattening layer 30 is often made of an organic material, such as a photosensitive acrylic resin. The pixel electrode 32 is electrically connected to one of the source electrode 16 and the drain electrode 18 on the semiconductor layer 14 through a contact hole 34 penetrating the flattening layer 30 and the passivation film 28.

An insulating layer 36 is formed on the flattening layer 30 and the pixel electrode 32. The insulating layer 36 is formed on the perimeter of the pixel electrode 32 so as to make an opening on a part (e.g., the center) of the pixel electrode 32. The insulating layer 36 forms a bank, that surrounds a part of the pixel electrode 32.

A light emitting element layer 38 is disposed on the pixel electrode 32. The light emitting element layer 38 is separately provided to each pixel electrode 32, and also disposed over the insulating layer 36. In this case, the light emitting element layers 38 emit light in blue, red, and green colors corresponding to respective pixels. The colors corresponding to respective pixels are not limited to these colors, but may include yellow or white. The light emitting element layer 38 is formed by, for example, vapor deposition. Alternatively, the light emitting element layer 38 may be formed on the entire display area DA (see FIG. 1) over the multiple pixels. In other words, the light emitting element layer 38 may be continuously formed over the insulating layer 36. In this case, the light emitting element layer 38 is applied to the insulating layer 36 by solvent dispersion. In a case where the light emitting element layer 38 is formed over the multiple pixels, the light emitting element layer 38 emits light in white color in the all sub-pixels, and takes out a wavelength portion of a desired color through a color filter (not shown).

A counter electrode 40 (common electrode or cathode) is provided on the light emitting element layer 38. The counter electrode 40 is disposed on the insulating layer 36, which is a bank. A light emitting element 42 is formed so as to include the light emitting element layer 38 and also the pixel electrode 32 and the counter electrode 40, between which the light, emitting element layer 38 is disposed. Each of the pixels includes a light emitting element 42. The light emitting element layer 38 is disposed between the pixel electrode 32 and the counter electrode 40, controlled in brightness by an electric current that flows between them, and emits light. At least one of a hole transport layer and a hole injection layer (both are not shown) may be provided between the light emitting element layer 38 and the pixel electrode 32. At least one of an electron transport layer and an electron injection layer (both are not shown) may be provided between the light emitting element layer 38 and the counter electrode 40.

The light emitting element layer 42 is covered by a sealing layer 44 laminated on the counter electrode 40, and thus sealed and protected from moisture. The sealing layer 44 may include at least one inorganic insulating layer 46 made of SiN, for example, and may be a lamination structure. The sealing layer 44 may include at least one organic insulating layer 48 made of resin, for example, between a pair of inorganic insulating layers 46. The sealing layer 44 covers the display area DA (see FIG. 1). A film 52 is adhered to the sealing layer 44 through an adhesive layer 50. The film 52 is made of, for example, polyethylene terephthalate, cycloolefin polymer resin, or cycloolefin copolymer resin.

As shown in FIG. 2, a circuit layer 54 for controlling the light emitting elements 42 is laminated on the first flexible layer 10. The first flexible layer 10 has a first interface 56 with a layer (e.g., circuit layer 54) that the upper or lower surface of the first flexible layer 10 is in contact with. A display element layer 58 is laminated on the circuit layer 54 on which the light emitting elements 42 are disposed. The layers include the sealing layer 44 that seals the display element layer 58.

The layers include a second flexible layer 60 made of, for example, polyethylene terephthalate, cycloolefin polymer resin, or cycloolefin copolymer resin. The second flexible layer 60 is the outermost layer, which is the top or bottom (bottom in FIG. 2) of the layers of the display device. The second flexible layer 60 has a second interface 62, which is different from the first interface 56, with a layer that the upper of lower surface of the second flexible layer 60 is in contact with. The laminated layers include an adhesive layer 64 that adheres the first flexible layer 10 to the second flexible layer 60. The second interface 62 is disposed between the second flexible layer 60 and the adhesive layer 64.

Figure 4:
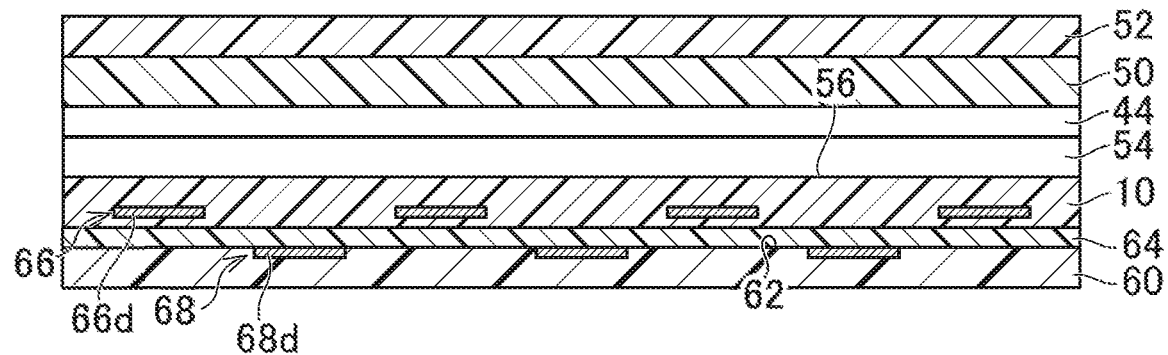
FIG. 4 is a cross-sectional view of the display device taken along the line IV-IV in FIG. 1.

As shown in FIGS. 1, 2, and 4 (a cross-sectional view of the display device taken along the line IV-IV in FIG. 1), the display device includes a plurality of first shape-memory wires 66. The first shape-memory wires 66 are disposed within the first flexible layer 10 or on the first interface 56 (in this embodiment, within the first flexible layer 10). The first shape-memory wires 66 memorize their extended state (straightly-extended state). As such, when the first shape-memory wires 66 are bent at a certain temperature (transformation point) or below, the first shape-memory wires 66 return to the original state (straightly-extended state) when heated to the temperature or above.

As shown in FIG. 1, edges 66a and 66b of the first shape-memory wire 66 are disposed side by side. The first shape-memory wire 66 includes a forward portion 66c linearly extending from one of the edges, the edge 66, in the first direction D1. The first shape-memory wire 66 includes a connecting portion 66d extending from the forward portion 66c in a second direction D2 that intersects the first direction D1. The first shape-memory wire 66 includes a return portion 66e linearly extending from the connecting portion 66d in the first direction D1 to the other edge, the edge 66b.

The display device includes a plurality of second shape-memory wires 68. As shown in FIG. 2, the second shape-memory wires 68 are disposed within the second flexible layer 60 or on the second interface 62 (in this embodiment, on the second interface 62). The second shape-memory wires 68 memorize their bending state. The bending state may be a state where, for example, the display device is bent with a surface for displaying an image being inside, or with the opposite surface being inside. When the second shape-memory wires 68 are straightened at a certain temperature (transformation point) or below, the second shape-memory wires 68 return to the original state (bending state) when heated to the temperature or above.

Edges 68a and 68b of the second shape-memory wire 68 are disposed side by side. The second shape-memory wire 68 includes a forward portion 68c linearly extending from one of the edges, the edge 68a, in the first direction D1. The second shape-memory wire 68 includes a connecting portion 68d extending from the forward portion 68c in a second direction D2 that intersects the first direction D1. The second shape-memory wire 68 includes a return portion 68e linearly extending from the connecting portion 68d in the first direction D1 to the other edge, the edge 68b.

As shown in FIGS. 2 and 4, the first, shape-memory wires 66 and the second shape-memory wires 68 are disposed at different positions in the laminating direction of the layers, and thus the first shape-memory wires 66 and the second shape-memory wires 68 are located apart from one another. Further, the first shape-memory wires 66 and the second shape-memory wires 68 are disposed so as not to overlap the laminating direction of the laminated layers. Specifically, the first shape-memory wires 66 and the second shape-memory wires 68 are alternately arranged in a staggered pattern in the second direction. With this arrangement, the first, shape-memory wires 66 can be positioned further away from the second shape-memory wires 68.

Figure 5:
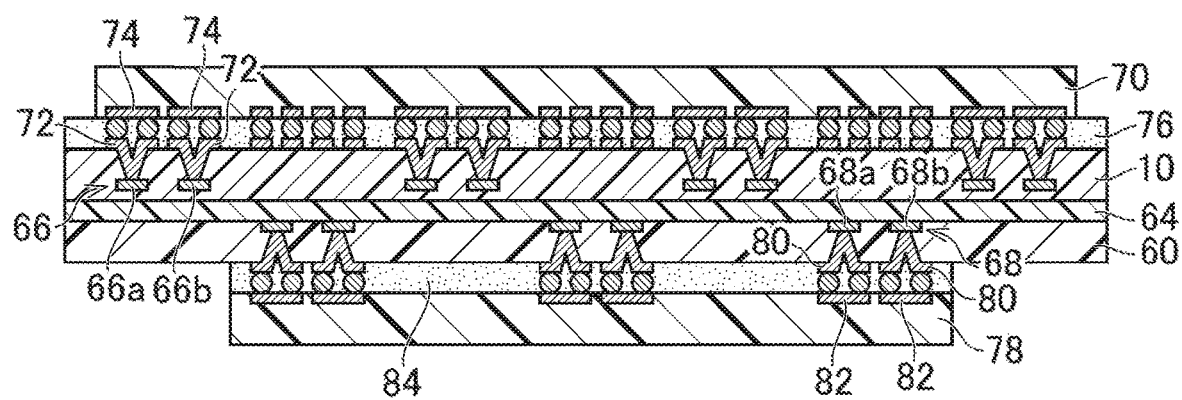
FIG. 5 is a cross-sectional view of the display device taken along the line V-V in FIG. 1.

FIG. 5 is a cross-sectional view of the display device taken along the line V-V in FIG. 1. The first shape-memory wires 66 are provided so as to be electrically heated. As such, the first flexible layer 10 is connected, to a first flexible printed substrate 70 for external electrical connection. Specifically, terminals 72 are provided on the first flexible layer 10 so as to connect to both of the edges 66a and 66b of the first shape-memory wire 66. The terminals 74 of the first flexible printed substrate 70 and the terminals 72 provided on the first flexible layer 10 are electrically connected through an anisotropic conductive film 76.

When an electric current flows from the first flexible printed substrate 70 to the first shape-memory wires 66, the first shape-memory wire 66 is heated by Joule heat. The first shape-memory wire 66 memorizes the extended state, and thus straightens itself from the bending state by the heat. This enables the bent or rolled display to be deployed for use.

The second shape-memory wires 68 are provided so as to be electrically heated. As such, the second flexible layer 60 is connected to a second flexible printed substrate 78 for external electrical connection. Specifically, terminals 80 are provided on the second, flexible layer 60 so as to connect to both of the edges 68a and 68b of the second shape-memory wire 68. The terminals 82 of the second flexible printed substrate 78 and the terminals 80 provided on the second flexible layer 60 are electrically connected through an anisotropic conductive film 84.

When an electric current flows from the second flexible printed substrate 78 to the second shape-memory wires 68, the second shape-memory wires 68 are heated by Joule heat. The second shape-memory wire 68 memorizes the bending state, and thus bends itself by the heat from the extended state. This enables the display to be folded or rolled for portable convenience.

According to this embodiment, the first shape-memory wires 66 and the second shape-memory wires 68 are positioned separately from each other in the laminating direction of the laminated layers, and thus the heat is hardly transferred from each other. This prevents malfunction of the display when the display is electrically deformed.

FIGS. 6A to 7C show a manufacturing method of the display device according to the first embodiment of the present invention.

Figure 6A:
FIGS. 6A to 6D show a manufacturing method of the display device according to the first embodiment, of the present invention.
Figure 6B:
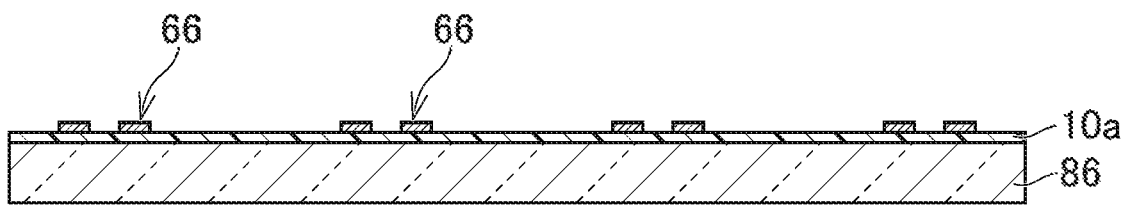

As shown in FIG. 6A, a lower layer film 10a made of a material (e.g., polyimide resin) of the first flexible layer 10 is formed on a glass substrate 86. As shown in FIG. 6B, the first shape-memory wires 66 are formed on the lower layer film 10a. The material of the lower layer film 10a is NiTi alloy (NiTiCo alloy or NiTiCu alloy) and CuZnAl alloy, for example.

The first shape-memory wire 66 is caused to memorize the extended state. In order to make the first shape-memory wire 66 memorize the shape, the first shape-memory wire 66 is heated to the temperature higher than the critical temperature to clear the memory, and then kept heated in a shape (extended state) to memorize at the temperature lower than the critical temperature for a relatively long period of time. It is possible to make the alloy memorize the shape by fully ordering the alloy with heat. The shape recovery temperature is 40 to 100° C., preferably 40 to 70° C.

Figure 6C:
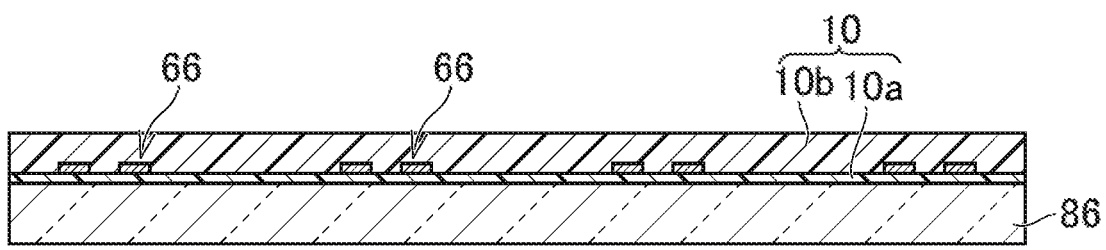
Figure 6D:
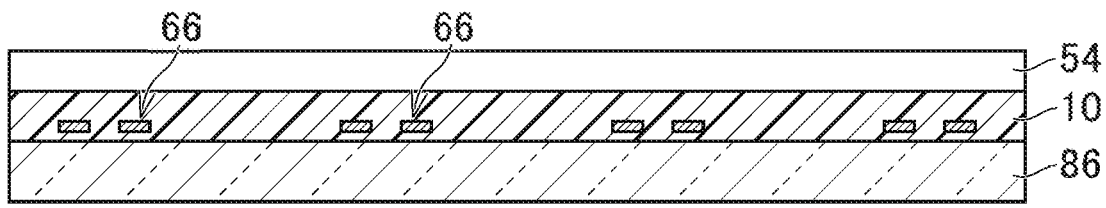

As shown in FIG. 6C, an upper layer film 10b is formed on the lower layer film 10a so as to cover the first shape-memory wires 66. The upper layer film '10b and the lower layer film 10a are made of the same material, and they are integrated to form the first flexible layer 10. The first shape-memory wires 66 are disposed within the first flexible layer 10. As shown in FIG. 6D, the circuit layer 54 is formed on the first flexible layer 10. The details of the circuit layer 54 are as described above with reference to FIG. 3.

Figure 7A:
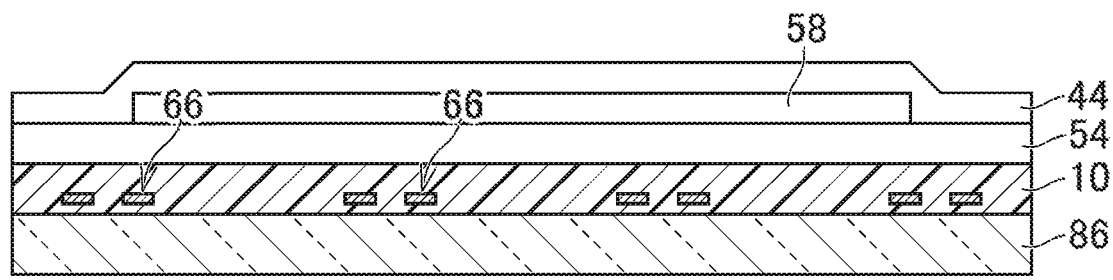
FIGS. 7A to 7C show a manufacturing method of the display device according to the first embodiment of the present invention.
Figure 7B:
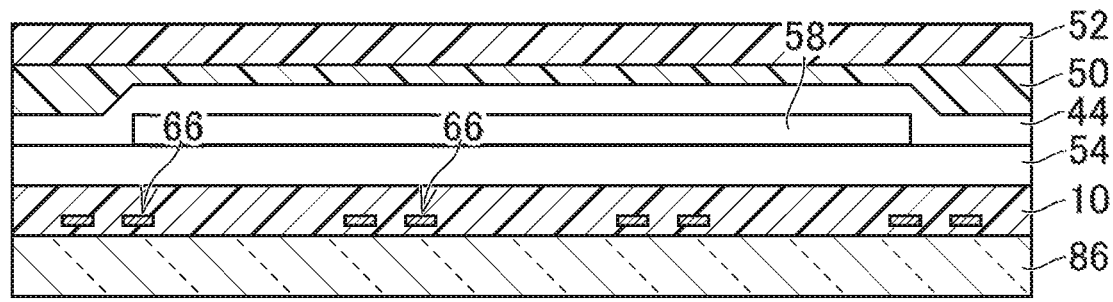
Figure 7C:
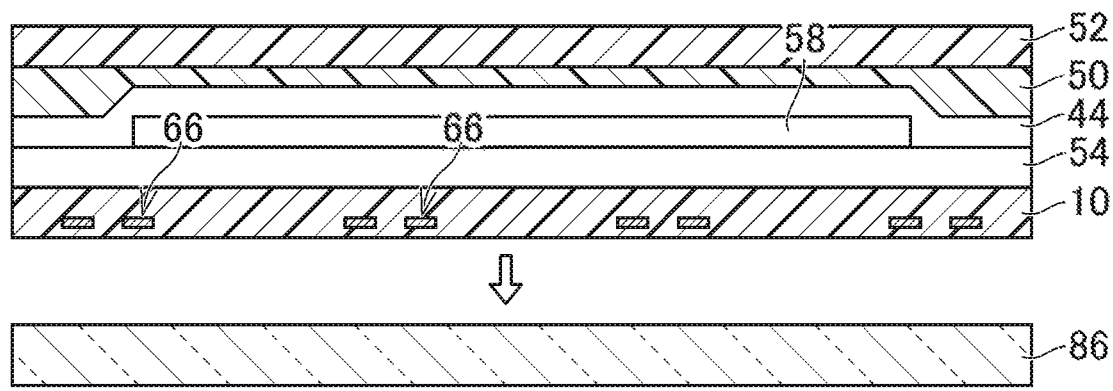

As shown in FIG. 7A, the display element layer 58 and the sealing layer 44 are formed on the circuit layer 54. The details of these layers are also as described above with reference to FIG. 3. As shown in FIG. 7B, the film 52 is adhered to the sealing layer 44 through the adhesive layer 50. The film 52 is used for protecting the sealing layer 44 and preventing the reflection of external light, and not necessarily adhered to the sealing layer 44 if these functions are not necessary. Subsequently, as shown in FIG. 7C, the glass substrate 86 is separated from the first flexible layer 10.

As shown in FIG. 2, the second flexible layer 60, in which the second shape-memory wires 68 are formed, is adhered to the first flexible layer 10 through the adhesive layer 64. The adhesive layer 64 is adhered to the second flexible layer 60 in advance and prepared. The second shape-memory wire 68 is caused to memorize the bending state. For example, the second shape-memory wire 68 is formed on the second flexible layer 60, bent together with the second flexible layer 60, and caused to memorize the bending state. The description of the first shape-memory wire 66 mentioned above can be applied to the details of the method to memorize the shape.

Second Embodiment

Figure 8:
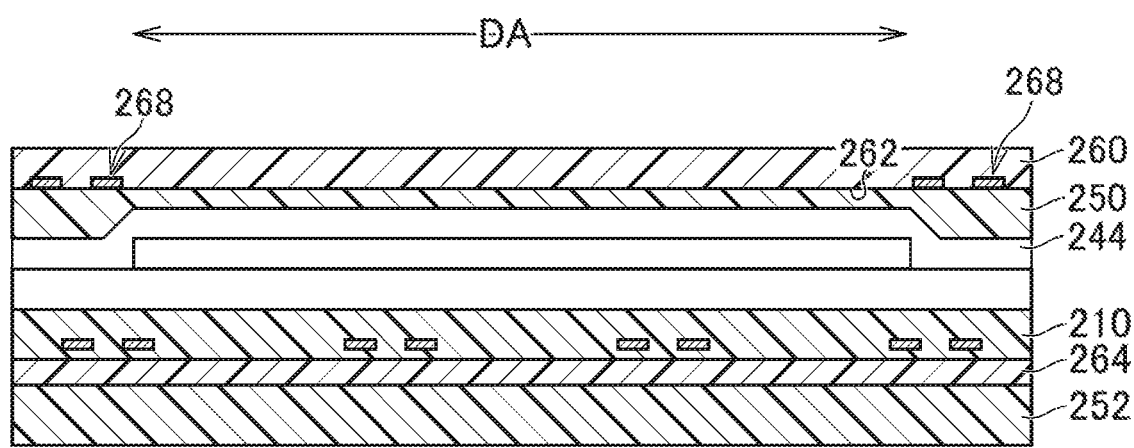
FIG. 8 is a cross-sectional view of the display device according to the second embodiment of the present invention.

FIG. 8 is a cross-sectional view of the display device according to the second embodiment of the present invention. In this embodiment, a second flexible layer 260 is the outermost layer on the side where an image is displayed. Specifically, the second flexible layer 260 is adhered to a sealing layer 244 through an adhesive layer 250. Second shape-memory wires 268 are positioned between the adhesive layer 250 and the second flexible layer 260 (second interface 262). The second shape-memory wires 268 are disposed so as to avoid the display area DA. A film 252 is adhered to a first flexible layer 210 through an adhesive layer 264. Other details are the same as those described in the first embodiment.

Third Embodiment

Figure 9:
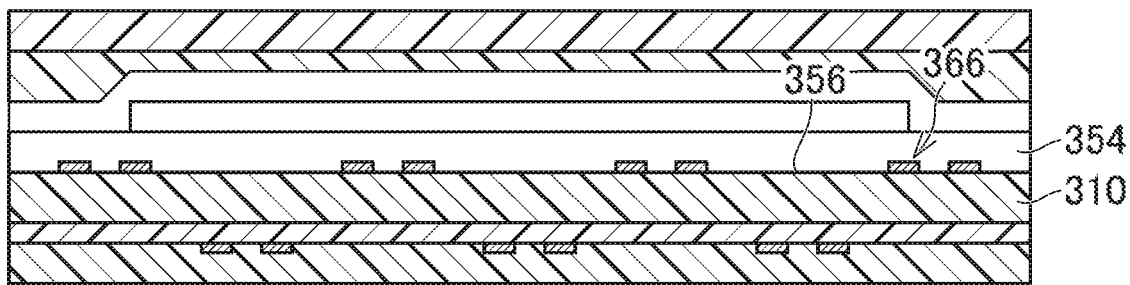
FIG. 9 is a cross-sectional view of the display device according to the third embodiment of the present invention.

FIG. 9 is a cross-sectional view of the display device according to the third embodiment of the present invention. In this embodiment, a layer that is in contact with a first flexible layer 310 through a first interface 356 is a circuit layer 354. First shape-memory wires 366 are provided on the first interface 356. Other details are the same as those described in the first embodiment.

Fourth Embodiment

Figure 10:
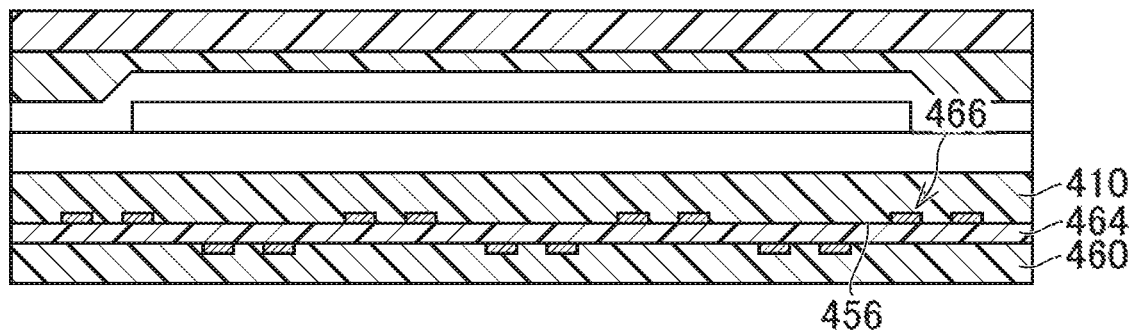
FIG. 10 is a cross-sectional view of the display device according to the fourth embodiment of the present invention.

FIG. 10 is a cross-sectional view of the display device according to the fourth embodiment of the present invention. In this embodiment, a first flexible layer 410 and a second flexible layer 460 are adhered to each other through an adhesive layer 464. A first interface 456 is positioned between the first flexible layer 410 and the adhesive layer 464. First shape-memory wires 466 are provided on the first interface 456. Other details are the same as those described in the first embodiment.

Figure 11:
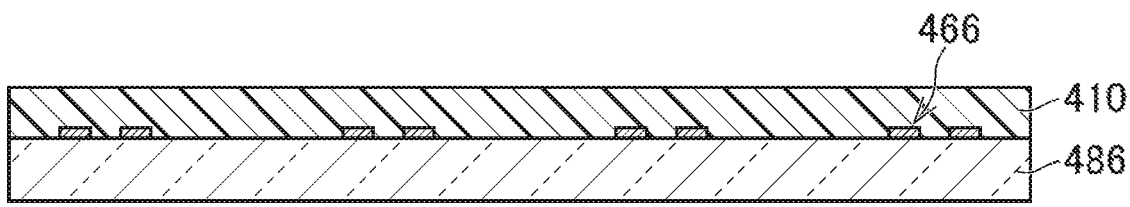
FIG. 11 is a diagram explaining a manufacturing method of the display device according to the fourth embodiment of the present invention.

FIG. 11 is a diagram explaining the manufacturing method of the display device according to the fourth embodiment of the present invention. As shown in FIG. 11, in order to form the first shape-memory wires 466 at the portions indicated in FIG. 10, the first shape-memory wires 466 are formed on a glass substrate 486, and a first flexible layer 410 is formed on the first shape-memory wires 466. The processes thereafter are the same as the steps described above by referring to FIGS. 6D to 7C. The structure shown in FIG. 10 can be obtained by removing the glass substrate 486 from the first shape-memory wires 466 and the first flexible layer 410.

The display device is not limited to an organic electroluminescent display device, but may be a display device having a light-emitting element such as a quantum-dot light emitting diode (QLED) in each pixel, or a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
a first shape-memory wire that memorizes an extended state and is configured to be electrically heated;
a second shape-memory wire that memorizes a bending state and is configured to be electrically heated; and
a plurality of laminated layers, wherein
the laminated layers comprise:
   a first flexible layer;
   a second flexible layer;
   a display element layer on which a plurality of light emitting elements are disposed and arranged in a display area for displaying an image;
   a circuit layer for controlling the light emitting elements; and
   a sealing layer that seals the display element layer,
the first flexible layer includes a first interface at either an upper side or a lower side of the first flexible layer,
the second flexible layer includes a second interface at either an upper side or a lower side of the second flexible layer, the second interface being different from the first interface,
the first shape-memory wire is disposed within the first flexible layer or on the first interface,
the second shape-memory wire is disposed within the second flexible layer or on the second interface,
at least one of the first shape-memory wire and the second shape-memory wire overlaps with the display area in a plan view,
each of the first shape-memory wire and the second shape-memory wire comprises:
a first edge and a second edge positioned adjacent to each other;
a forward portion and a return portion linearly extending from respective of the first and second edges in parallel to each other in a first direction;
the return portion being apart from the forward portion in the plan view;
the forward and return portions having respective ends opposite the first and second edges, wherein the respective ends of the forward and return portions are connected to each other at a bend including a connection portion; and
the connecting portion being outside and without overlapping with the display area in the plan view, the connecting portion having opposed ends respectively connected with the ends of the forward portion and the return portion at the bend, the connecting portion extending along a second direction that intersects the first direction,
the respective ends of the forward portion and the return portion each being outside the display area, and
the forward portion and the return portion of the first shape-memory wire being parallel to each other without having the second shape-memory wire interposed therebetween.

2. The display device according to claim 1, wherein the first shape-memory wire and the second shape-memory wire are disposed so as not to overlap a laminating direction of the laminated layers.

3. The display device according to claim 1, wherein the first shape-memory wire includes a plurality of first shape-memory wires, and the second shape-memory wire includes a plurality of second shape-memory wires.

4. The display device according to claim 3, wherein the plurality of first shape-memory wires are at least three first shape-memory wires, and the plurality of second shape-memory wires are at least three second shape-memory wires.

5. The display device according to claim 1, wherein the circuit layer is in contact with the first flexible layer through the first interface, and the display element layer is laminated on the circuit layer.

6. The display device according to claim 5, wherein the first shape-memory wires are disposed within the first flexible layer.

7. The display device according to claim 5, wherein the first shape-memory wires are disposed on the first interface.

8. The display device according to claim 1, wherein the laminated layers further include an adhesive layer provided between the first and second interfaces and that adheres the first flexible layer to the second flexible layer.

9. The display device according to claim 1, wherein the second flexible layer is an outermost layer of the laminated layers disposed on either a top or a bottom of the laminated layers.

10. The display device according to claim 1, wherein the second flexible layer is an outermost layer of the laminated layers on a side of the display area, and the second shape-memory wires are disposed so as to avoid the display area.

11. The display device according to claim 1, wherein the connection portion of the first shape-memory wire and the connection portion of the second shape-memory wire are aligned with one another in the second direction.

12. The display device according to claim 1, the first edge of the forward portion of the first shape-memory wire and the first edge of the forward portion of the second shape-memory wire are arranged outside the display area.

13. The display device according to claim 12, wherein the forward portion and the return portion of each of the first shape-memory wire and the second shape-memory wire are arranged parallel to each other.

14. The display device according to claim 1, further comprising terminals, wherein the display area is between the connecting portion and the terminals in the plan view.

* * * * *